(12) United States Patent
Herron et al.

(10) Patent No.: US 12,014,587 B1
(45) Date of Patent: Jun. 18, 2024

(54) VEHICLE COMMUNICATION INTERFACE CABLE WITH INTEGRATED OSCILLOSCOPE

(71) Applicant: Opus IVS, Inc., Ann Arbor, MI (US)

(72) Inventors: Brian J. Herron, Dexter, MI (US); Mark W. Wine, Ann Arbor, MI (US)

(73) Assignee: Opus IVS, Inc., Dexter, MI (US)

( * ) Notice: Subject to any disclaimer, the term of this patent is extended or adjusted under 35 U.S.C. 154(b) by 717 days.

(21) Appl. No.: 17/139,178

(22) Filed: Dec. 31, 2020

(51) Int. Cl.
| | | |
|---|---|---|
| G07C 5/08 | (2006.01) | |
| G01R 27/02 | (2006.01) | |
| G06F 13/42 | (2006.01) | |
| H01R 12/53 | (2011.01) | |
| H01R 24/20 | (2011.01) | |
| H01R 24/28 | (2011.01) | |
| H01R 107/00 | (2006.01) | |
| H05K 5/00 | (2006.01) | |
| H05K 5/02 | (2006.01) | |

(52) U.S. Cl.
CPC ........... *G07C 5/0816* (2013.01); *G01R 27/02* (2013.01); *G06F 13/4282* (2013.01); *H01R 24/20* (2013.01); *H01R 24/28* (2013.01); *H05K 5/0052* (2013.01); *H05K 5/0247* (2013.01); *G06F 2213/0042* (2013.01); *H01R 12/53* (2013.01); *H01R 2107/00* (2013.01); *H01R 2201/20* (2013.01); *H01R 2201/26* (2013.01)

(58) Field of Classification Search
CPC ... G07C 5/0816; G01R 27/02; G06F 13/4282; G06F 2213/0042; H01R 24/20; H01R 24/28; H01R 12/53; H01R 2107/00; H01R 2201/20; H01R 2201/26; H05K 5/0052; H05K 5/0247
See application file for complete search history.

(56) References Cited

U.S. PATENT DOCUMENTS

| | | | | |
|---|---|---|---|---|
| 5,659,680 | A * | 8/1997 | Cunningham ... | G01R 31/31907 714/25 |
| 7,350,159 | B2 * | 3/2008 | Cancilla ................... | G01D 1/00 715/854 |
| 7,840,321 | B2 * | 11/2010 | Torlo ....................... | H04L 63/10 701/31.7 |

(Continued)

*Primary Examiner* — Luis A Martinez Borrero
(74) *Attorney, Agent, or Firm* — Gardner, Linn, Burkhart Ondersma LLP

(57) ABSTRACT

A vehicle communication interface cable includes a vehicle connector having a connector body configured to connect to a diagnostic port of a vehicle, and includes a vehicle communication interface connector having a connector body configured to connect to a vehicle communication interface, and a cable portion extending between the vehicle connector and vehicle communication interface connector, with the cable portion enabling communication from the vehicle connector to the vehicle communication interface connector. An oscilloscope circuit is integrated with the cable portion and is operatively connected with the vehicle connector to obtain measurements from the diagnostic port when connected thereto, with the oscilloscope circuit being operatively connected with the vehicle communication interface connector to provide measurements from the diagnostic port to the vehicle communication interface when the vehicle communication interface connector is connected to the vehicle communication interface.

22 Claims, 8 Drawing Sheets

(56) References Cited

U.S. PATENT DOCUMENTS

| | | | | |
|---|---|---|---|---|
| 8,340,855 B2* | 12/2012 | Chinnadurai | G07C 5/085 | 701/29.1 |
| 8,560,168 B2* | 10/2013 | Ruther | G07C 5/0825 | 370/338 |
| 8,630,765 B2* | 1/2014 | Chen | G07C 5/0825 | 701/32.7 |
| 8,935,440 B2* | 1/2015 | Davis | G06F 13/10 | 710/16 |
| 8,983,785 B2* | 3/2015 | Panko | G01R 13/0236 | 702/182 |
| 8,996,231 B2* | 3/2015 | Uratani | G01M 17/00 | 73/116.05 |
| 9,117,321 B2* | 8/2015 | Davis | G07C 5/0825 | |
| 9,286,265 B2* | 3/2016 | Simard | G06F 17/00 | |
| 9,304,062 B2* | 4/2016 | Ruther | B60R 16/0315 | |
| 9,633,492 B2* | 4/2017 | Panko | G07C 5/0883 | |
| 9,639,996 B2* | 5/2017 | Treharne | G07C 5/0825 | |
| 11,110,816 B2* | 9/2021 | Rini | B60L 53/62 | |
| 2003/0020759 A1* | 1/2003 | Cancilla | G01D 1/00 | 715/810 |
| 2004/0239516 A1* | 12/2004 | Jones | G07C 5/008 | 340/679 |
| 2005/0193252 A1* | 9/2005 | Cancilla | G01D 1/00 | 714/29 |
| 2008/0071440 A1* | 3/2008 | Patel | H04Q 9/00 | 701/31.4 |
| 2008/0119981 A1* | 5/2008 | Chen | G07C 5/0825 | 701/31.4 |
| 2012/0041638 A1* | 2/2012 | Johnson | G06F 11/3003 | 701/33.1 |
| 2012/0044052 A1* | 2/2012 | Davis | G07C 5/0825 | 340/6.1 |
| 2012/0044086 A1* | 2/2012 | Ruther | G07C 5/0816 | 340/870.02 |
| 2012/0046807 A1* | 2/2012 | Ruther | B60R 25/24 | 701/2 |
| 2012/0046824 A1* | 2/2012 | Ruther | G07C 5/0825 | 701/31.5 |
| 2012/0046825 A1* | 2/2012 | Ruther | H04L 67/125 | 701/31.5 |
| 2012/0046826 A1* | 2/2012 | Panko | G07C 5/0858 | 702/81 |
| 2012/0047291 A1* | 2/2012 | Davis | G06F 13/10 | 710/14 |
| 2013/0066512 A1* | 3/2013 | Willard | G07C 5/0808 | 701/29.1 |
| 2014/0005881 A1* | 1/2014 | Hardesty | G07C 5/0808 | 701/32.8 |
| 2014/0019000 A1* | 1/2014 | Ruther | G01M 17/007 | 701/31.4 |
| 2014/0277827 A1* | 9/2014 | Chinnadurai | G01M 17/007 | 73/488 |
| 2014/0281063 A1* | 9/2014 | Martini | G06F 13/385 | 710/63 |
| 2015/0371461 A1* | 12/2015 | Treharne | G07C 5/0816 | 701/31.4 |
| 2016/0071336 A1* | 3/2016 | Owen | G07C 5/0808 | 701/33.5 |
| 2017/0372532 A1* | 12/2017 | Merg | G07C 5/008 | |
| 2018/0095609 A1* | 4/2018 | Merg | G07C 5/008 | |
| 2018/0095638 A1* | 4/2018 | Merg | G05B 23/0216 | |
| 2020/0086760 A1* | 3/2020 | Rini | B60L 53/62 | |
| 2020/0134934 A1* | 4/2020 | Covington | G07C 5/008 | |
| 2020/0200821 A1* | 6/2020 | Freidhof | G01R 31/31917 | |
| 2022/0234602 A1* | 7/2022 | Chen | G01R 13/00 | |

* cited by examiner

VEHICLE COMMUNICATION INTERFACE CABLE WITH INTEGRATED OSCILLOSCOPE

BACKGROUND AND FIELD OF THE INVENTION

The present invention is directed to a vehicle communication interface cable with integrated oscilloscope and a vehicle communication interface device with such a cable whereby the vehicle communication device is able to read, process and/or display measurements by the oscilloscope from the pins of a connector for a vehicle electronic system.

In automotive repair garages, many of the tools used to diagnose and repair cars have transitioned to computer-based systems. Vehicle diagnostic systems employing diagnostic scan devices or tools are used in automotive repair facilities to diagnose and repair computer-based vehicle systems, where vehicles may have differing computer-based systems depending on the configuration and options installed on the vehicle. The diagnostic systems may employ vehicle communication interface devices that are configured with protocols to enable communication with the electronic control units of the electronic system of the vehicle, including for scanning, diagnosing and/or programming the electronic control units. To perform these operations the vehicle communication interface device is connected to the vehicle by a cable, where one end of the cable is plugged into a port of the vehicle, such as an onboard diagnostic port, and the other end of the cable is plugged into the vehicle communication interface device.

SUMMARY OF THE INVENTION

The present invention provides a vehicle communication interface cable with an integrated oscilloscope for connecting a vehicle communication interface device ("VCI") with an electronic system of a vehicle where the oscilloscope of the cable is able to take measurements, such as voltage waveform capture or resistance measurements, over time from the electronic system of the vehicle as detected on the pins of a diagnostic port of the vehicle, and provide the measurements to the VCI such that the VCI may be used to read, process and/or display the measured values. The VCI and cable may thus be used at least for scanning of the electronic system of the vehicle, including such as for scanning the electronic control units of the electronic system for diagnostic trouble codes ("DTCs"), as well as may be used for determining if the emissions system of the vehicle has been tampered with, such as to circumvent emissions testing.

An embodiment of a vehicle communication interface cable in accordance with the present invention includes a vehicle connector having a connector body configured to connect to a diagnostic port of a vehicle, a vehicle communication interface connector having a connector body configured to connect to a vehicle communication interface, a cable portion extending between the vehicle connector and vehicle communication interface connector to enable communication there between, and an oscilloscope circuit. The oscilloscope circuit is integrated with the cable portion and is operatively connected with the vehicle connector to obtain measurements from the diagnostic port when the vehicle connector is connected to the diagnostic port, and where the oscilloscope circuit is operatively connected with the vehicle communication interface connector to provide measurements from the diagnostic port to the vehicle communication interface when the vehicle communication interface connector is connected to the vehicle communication interface.

The oscilloscope circuit may be configured as a printed circuit board, and may include an oscilloscope integrated circuit and a multiplexer integrated circuit, where the oscilloscope circuit is configured to measure voltage waveforms or resistance values at the diagnostic port when the vehicle connector is connected to the diagnostic port.

In a particular embodiment the vehicle connector includes multiple pins and wires that are in operative communication with the pins extend from the vehicle connector to the oscilloscope circuit within the cable portion. Additional wires extend from the oscilloscope circuit to the vehicle communication interface connector. In a specific embodiment the vehicle connector has sixteen pins, with wires that are operatively connected with the pins and the oscilloscope circuit, and with the vehicle communication interface connector having twenty-six pin receptacles.

In a further configuration the cable portion comprises a first cable portion and a second cable portion and a housing with the oscilloscope circuit disposed within the housing, and with the first cable portion extending from the vehicle connector to the housing and with the second cable portion extending from the vehicle communication interface connector to the housing.

The interface cable may further include an additional vehicle communication interface connector and an additional cable portion, with the additional vehicle communication interface connector being connected to the additional cable portion and the additional cable portion being integrated with the cable portion. In such an embodiment the additional vehicle communication interface connector is configured to connect to the same vehicle communication interface as the vehicle communication interface connector, with the interface cable being configured to communicate signals between the additional vehicle communication interface connector and the vehicle connector. In particular, in such an embodiment, the vehicle communication interface connector comprises a USB connector and the additional vehicle communication interface connector is not in operative communication with the oscilloscope circuit.

A vehicle communication system in accordance with an embodiment of the present invention includes a vehicle communication interface cable having opposed ends and a vehicle communication interface, where the vehicle communication interface cable is selectively coupled to the vehicle communication interface at one end and is selectively coupled to a diagnostic port of a vehicle at the other end. The vehicle communication interface cable has at one end a vehicle communication interface connector configured to connect to the vehicle communication interface, and has a vehicle connector at the other end configured to connect to a diagnostic port of a vehicle, with the vehicle communication interface cable further including oscilloscope circuitry and a cable portion extending between the vehicle connector and vehicle communication interface connector.

Still further, a cable according to yet another aspect of the present invention, includes a first connector comprising a first body and a first plug, a second connector comprising a second body and a second plug, an oscilloscope circuit, and a cable portion extending between the first and second connectors. The oscilloscope circuit is integrated with the cable portion and a first group of wires extends from the oscilloscope circuit to the first connector and a second group of wires extends from the oscilloscope circuit to the second connector.

The vehicle communication interface cable with integrated oscilloscope is configured for connecting a vehicle communication interface device ("VCI") with an electronic system of a vehicle for diagnostic operations using the VCI, including to detect faults in the electronic system and/or to detect improper tampering with aspects of the electronic system, such as emissions system tampering. The interface cable with integrated oscilloscope may thus be used to provide additional or upgraded diagnostic capability to a VCI without having to supply an alternative VCI. Accordingly, users may tailor their equipment depending on the desired diagnostic testing and operations are desired to be performed. These and other benefits and advantages will be apparent upon reading the below description in combination with the drawings.

DESCRIPTION OF THE PREFERRED EMBODIMENTS

The present invention will now be described with reference to the accompanying figures, wherein the numbered elements in the following written description correspond to like-numbered elements in the figures.

Figure 1:
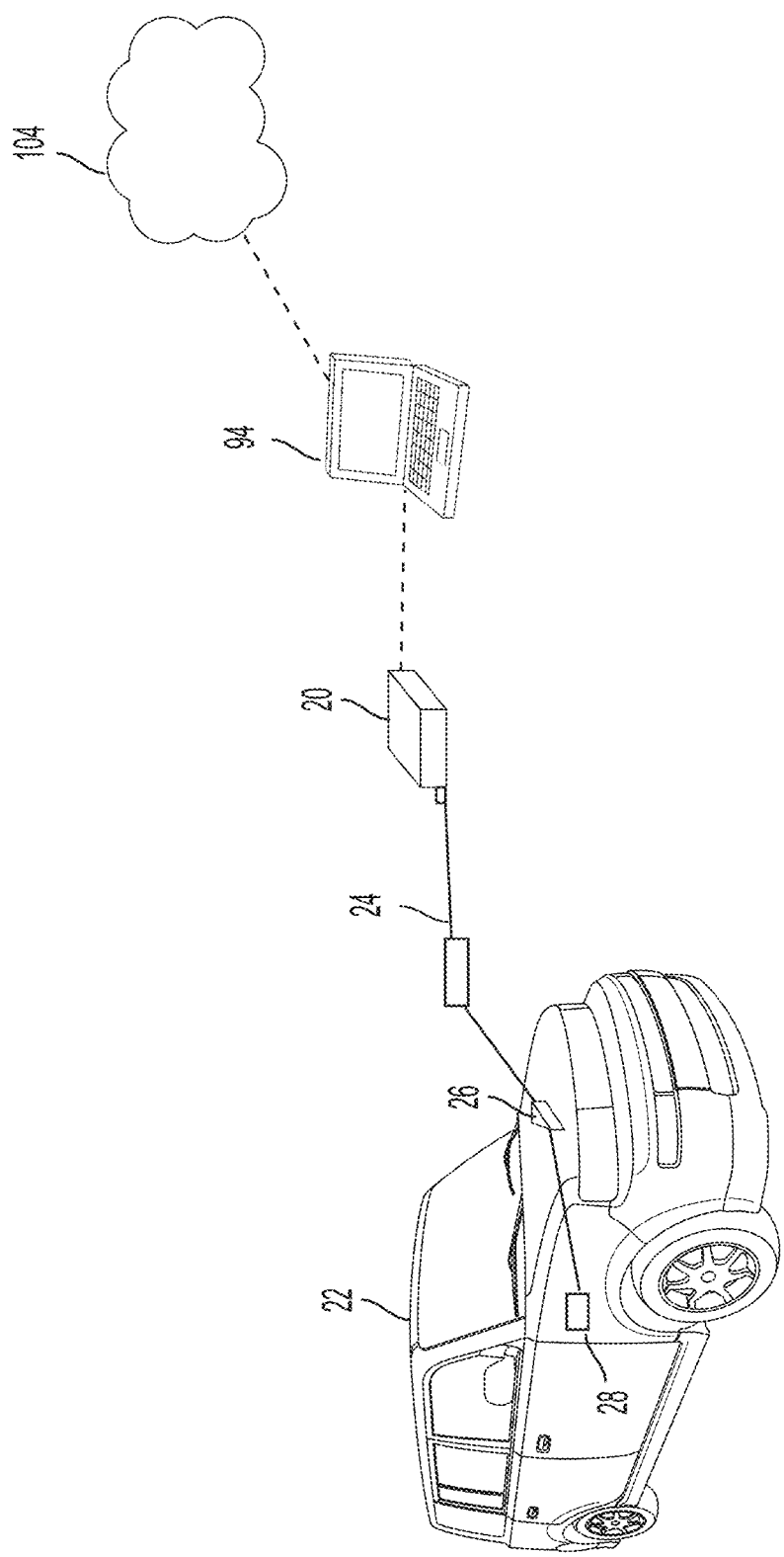
FIG. 1 is a schematic illustration of a vehicle interface cable with integrated oscilloscope connecting a vehicle interface device and vehicle in accordance with the present invention.

With reference to FIG. 1, a vehicle communication interface device or tool ("VCI") 20 is shown connected to a vehicle 22 by way of a vehicle interface cable 24 for use by a mechanic or operator in scanning, diagnosing and/or programming vehicle 22. In use, vehicle communication interface device 20 is configured to be connected by interface cable 24 to a diagnostic port 26 of vehicle 22, such as to an onboard diagnostic port ("OBD" or "OBDII" port) whereby the diagnostic device 20 is in communication with the electronic system 28 of vehicle 22. Vehicle communication interface device 20 is thereby operable for use in scanning, diagnosing and/or programing various electronic control units ("ECUs") of electronic system 28, such as an engine ECU 30, body ECU 32, brakes ECU 34, and/or other ECUs 36, and/or other electronic parts and components of vehicle 22 (see FIG. 9). In operation, data signals are exchanged between vehicle communication interface device 20 and electronic system 28 via interface cable 24. In accordance with aspects of the present invention, interface cable 24 includes an integrated oscilloscope configured to provide to VCI 20 measurements of the electronic system 28 as measured on the pins of the diagnostic port 26. Accordingly, in the illustrated embodiment VCI 20 may read, process and/or display the signals as measured by the oscilloscope, thereby providing additional diagnostic capability for an operator using VCI 20 to evaluate the vehicle electronic system 28.

Figure 2:
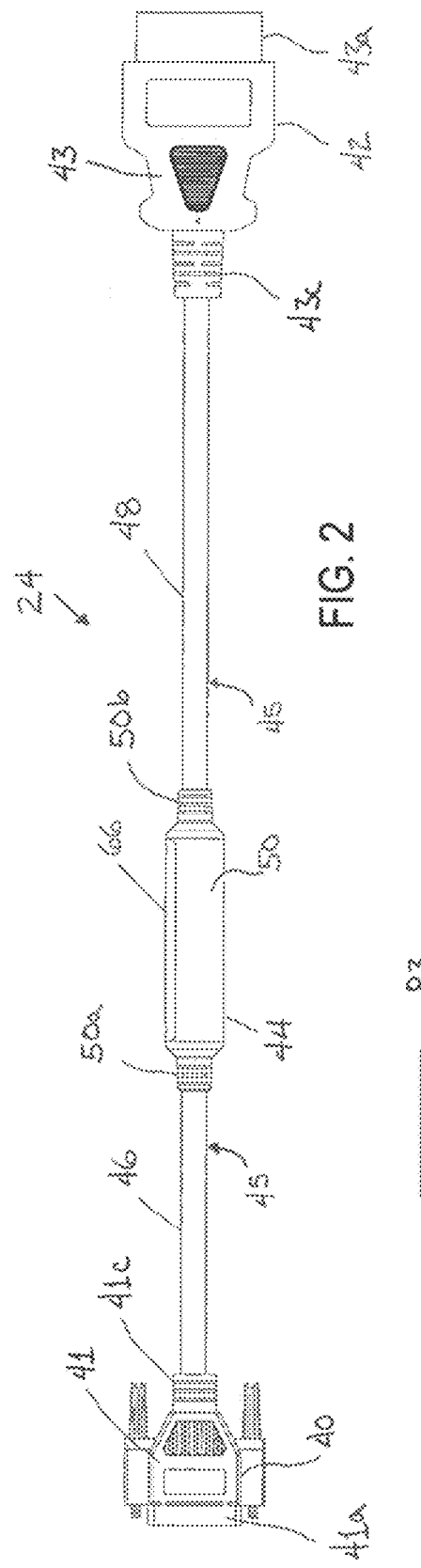
FIG. 2 is a top plan view of the cable of FIG. 1.
Figure 2B:
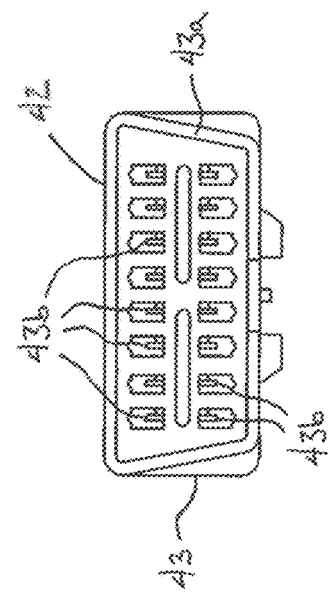
FIGS. 2A and 2B are end views of the respective connector ends of the cable of FIG. 2.
Figure 2C:
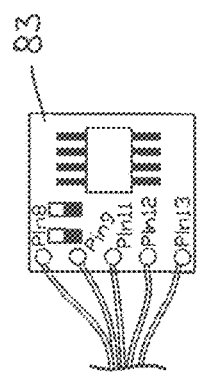
FIG. 2C is a top plan view of an internal circuit board of a connector of the cable of FIG. 2.
Figure 2A:
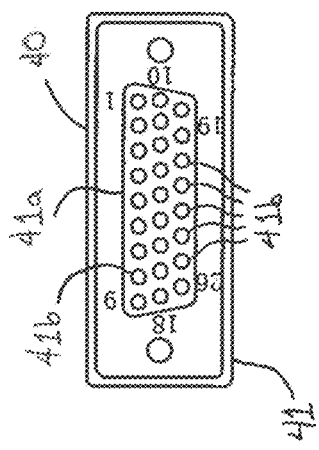
Figure 3:
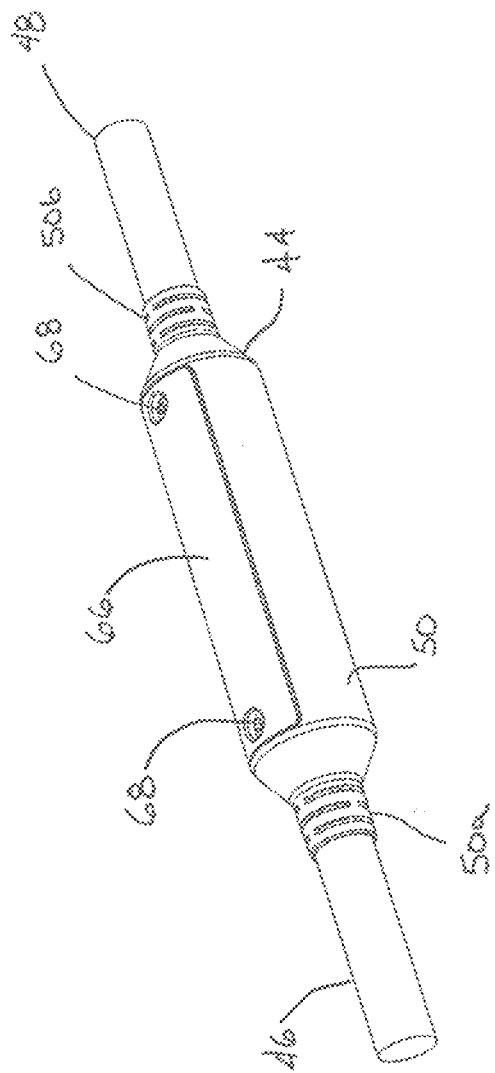
FIG. 3 is a partial perspective view of the cable of FIG. 2 illustrating an oscilloscope module of the cable.
Figure 4:
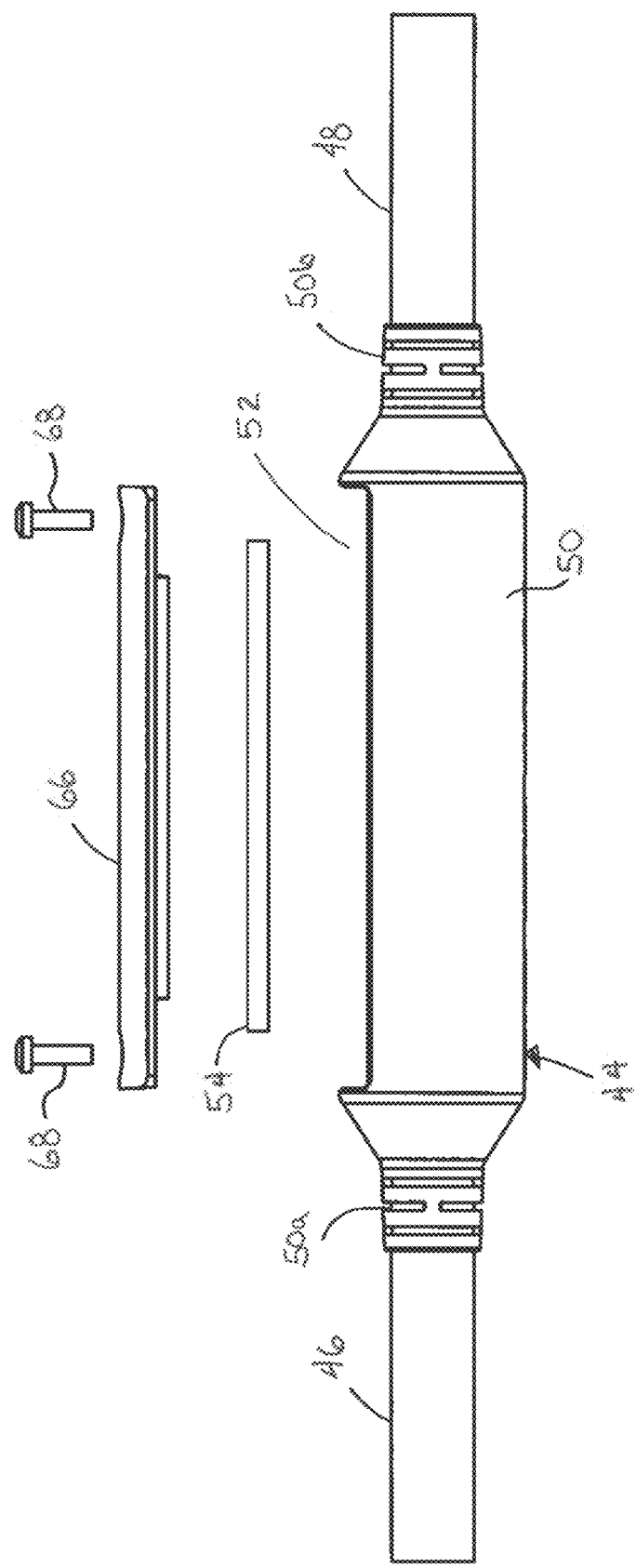
FIG. 4 is an exploded partial side view of the oscilloscope module of FIG. 3.
Figure 5:
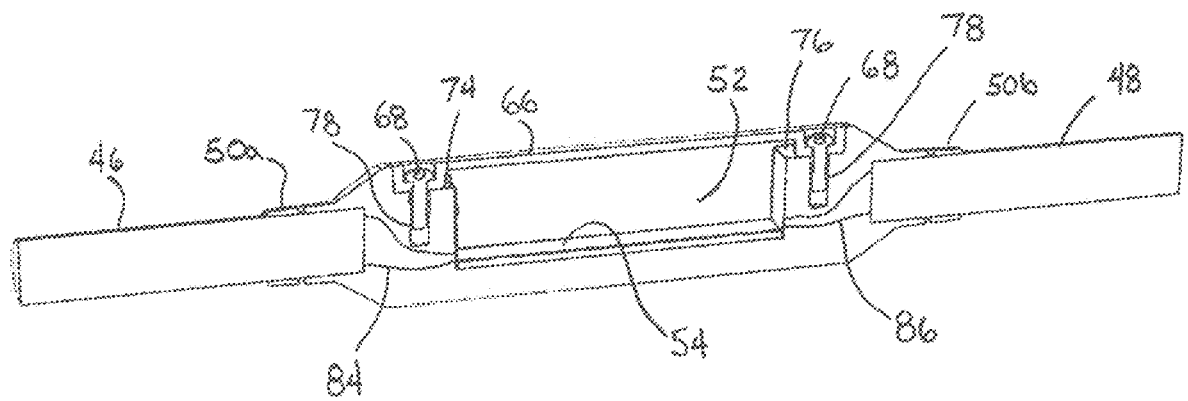
FIG. 5 is a side cross-sectional perspective view of the oscilloscope module of FIG. 3 illustrating an internal printed circuit board and wiring.

With initial reference to FIGS. 2, 2A and 2B, interface cable 24 includes a pair of connectors 40, 42 at opposed ends of cable 24 for connecting to a port or connector 38 on VCI 20 (see FIG. 8) and the vehicle diagnostic port 26 of vehicle 22, respectively. As illustrated, cable 24 additionally includes an oscilloscope module or enclosure 44 disposed along and integrated or connected with a flexible cable 45 between connectors 40, 42, where in the illustrated embodiment the flexible cable 45 comprises a flexible first cable portion 46 extending between connector 40 and oscilloscope module 44 and a flexible second cable portion 48 extending between connector 42 and oscilloscope module 44. In the illustrated embodiment, connector 40 of cable 24 includes a connector body or housing 41 with a plug or receptacle 41a and is configured as a female HDB26 connector for receipt at pin receptacles 41b of the twenty-six pins 38a of connector 38 of VCI 20, with connector body 41 including conventional threaded fasteners for securing to connector 38. First cable portion 46 is connected with connector body 41 at a flexible molded joint or receptacle 41c that is formed with connector body 41. Connector 42 of cable 24 includes a body or housing 43 and is configured as a plug-in sixteen pin connector for plugging plug 43a into port 26 of vehicle 22, where plug 43a includes pins 43b for engaging with the port 26. As shown, second cable portion 48 is connected with connector body 43 at a flexible molded joint or receptacle 43c that is formed with connector body 43.

Oscilloscope module 42 will now be discussed in more detail with reference to FIGS. 3-6. As there shown, oscilloscope module 42 includes a molded housing 50 having an internal cavity 52 within which an oscilloscope circuit or circuitry is disposed comprising a printed circuit board ("PCB") 54 that, as discussed in more detail below, includes one or more oscilloscope chips as well as a multiplexer chip. In the illustrated embodiment housing 50 is molded from PVC and includes opposed molded flexible end or joint portions 50a, 50b for engaging with and providing relief support to ends of first cable portion 46 and second cable portion 48. A lid or cover 66 is used to enclose PCB 54 within cavity 52 via fasteners 68, where cover 66 mounts to opposed platforms 74, 76 that each include a threaded hole 78 for receiving fasteners 68.

Figure 6:
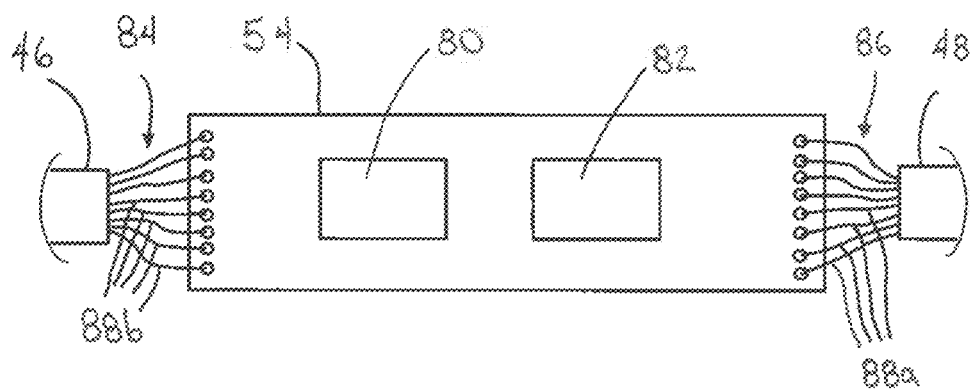
FIG. 6 is a top view of the printed circuit board of FIG. 5.

As understood from FIG. 6, in the illustrated embodiment oscilloscope PCB 54 includes an oscilloscope chip 80 and a multiplexer chip 82, where the chips 80, 82 are configured as integrated circuits mounted to PCB 54. Each cable portion 46, 48 includes a wire bundle 84, 86, respectively, that each include an outer sheathing and multiple wires or conductors 88a, 88b, respectively, that are operatively connected to PCB 54, such as via soldering or other connection techniques known in the art. In the illustrated embodiment, wire bundle 86 includes sixteen wires 88a (only eight shown in FIG. 6) that are operatively connected with the pins 43b of connector 42, whereby signals from electronic system 28 of vehicle 22 are detected by pins 43b at diagnostic port 26 and provided to PCB 54 when connector 42 is plugged into diagnostic port 26 of vehicle 22. Likewise, wire bundle 84 includes multiple wires 88b that are operatively connected to the pin receptacles 41b of connector 40 to thereby provide signals to VCI 20 when connector 40 of cable 24 is plugged into port 38 of VCI 20. Multiplexer chip 82 operates to selectively provide signals from selected wires 88a of cable portion 48 to oscilloscope chip 80 whereby selected signals from electronic system 26 as found on pins of the diagnostic port 26 may be processed via oscilloscope chip 80. That is vehicle 22 may include multiple networks within electronic system 28, such that voltage waveform or resistance measurements may be made on most or all of the pins of the diagnostic port 26, with multiplexer chip 82 being operable to selectively provide measurements from selected pins of diagnostic port 26. It should be appreciated that VCI 20 may be used to provide signals to PCB 54 for controlling which pin measurements are provided by PCB 54 to VCI 20.

PCB 54 may also function to pass signals directly between connectors 40 and 42, both from vehicle 22 to VCI 20 and from VCI 20 to vehicle 22, independent of use of multiplexer chip 82 and oscilloscope chip 80. Alternatively, however, wires 88a of cable portion 48 may separately pass through housing 50 and cable portion 46 to provide communication there between without use of PCB 54, in which case wires 88a would have an additional connection to PCB 54 and output wires 88b would be separately directed to connector 40. For example, a wire bundle 86 may extend through cavity 52 or be molded within housing 50 below cavity 52. It should thus be appreciated that alternative numbers of wires or conductors may be contained within each of cable portions 46, 48. Although shown as comprising a single oscilloscope chip 80, it should be appreciated that alternatively a chipset having more than one chip may be used for the oscilloscope functionality.

In the illustrated embodiment, oscilloscope chip 80 comprises a USB chip having input pins to which wires 88a are connected, with chip 80 operating to measure voltage waveforms and/or resistance on the pins of the diagnostic port 26. In the case of measuring resistance, the measured value is then supplied to VCI 20, such as for use in determining if a fault is present by measuring and/or monitoring the resistance at the pins of the diagnostic port 26. A fault may be determined, for example, by comparing a measured resistance to an expected or known resistance. Still further, the measured resistance value may be used to detect whether tampering to vehicle 20 has occurred, such as to detect if emissions tampering has been done by, for example, the use of emissions defeat efforts. For example, the resistance value as measured over time may be compared to expected changes and/or fluctuations in resistance that would otherwise occur but for the use of emissions defeat efforts, whereby the failure to act in an expected way indicates or is indicative of the use of emissions defeat or emissions tampering efforts on vehicle 20. Such tampering may include, for example, reprogramming and/or replacement of ECUs, and/or altering of emission related sensors on vehicle 22, such as oxygen sensors.

In the case of measuring voltage waveforms with chip 80, the measured voltage waveforms are likewise supplied to VCI 20, such as for use in determining if a fault is present by measuring and/or monitoring the waveform shape at the pins of the diagnostic port 26. A fault may be determined, for example, by comparing a measured waveform to an expected or known waveform. Still further, the measured waveform shape may be used to detect whether tampering to vehicle 20 has occurred, such as to detect if emissions tampering has been done by, for example, the use of emissions defeat efforts. For example, the waveform shape as measured over time may be compared to expected changes and/or fluctuations in waveforms that would otherwise occur but for the use of emissions defeat efforts, whereby the failure to act in an expected way indicates or is indicative of the use of emissions defeat or emissions tampering efforts on vehicle 20. Such tampering may include, for example, reprogramming and/or replacement of ECUs, and/or altering of emission related sensors on vehicle 22, such as oxygen sensors.

In the illustrated embodiment, the output from PCB 54, and thus of oscilloscope chip 80, may be transmitted from oscilloscope chip 80 to VCI 20, such as via connection to pin receptacles 41c of connector 40 for connection with pins 38 of port 38. VCI 20 may then be used to read, process and/or display the measured values. It should be appreciated that VCI 20 may thus include operational software and processing for receiving data from oscilloscope chip 80 and/or PCB 54 and processing the data, such as to display oscilloscope measured data over time. It should also be appreciated, however, that alternatively configured and/or operating oscilloscope chips may be employed, including for example alternative connections of or with wires 88a and/or wires 88b. For example, the wire bundle 86 within cable portion 48 may extend through housing 50 and cable portion 46 to connector 40, with an alternative connection of input wires 88a with PCB 54, and separate output wires 88b extending to connector 40. For example, the wire bundle 86 may be disposed through or molded into housing 50. Still further, an oscilloscope may be configured to measure voltages on pins of diagnostic port 26 in addition and/or alternative to measuring resistance. The PCB 54 may be configured for mounting within housing 50 and connecting with wires 88a, 88b by a plug-in style connection, or via other connection methods known in the art.

Figure 7:
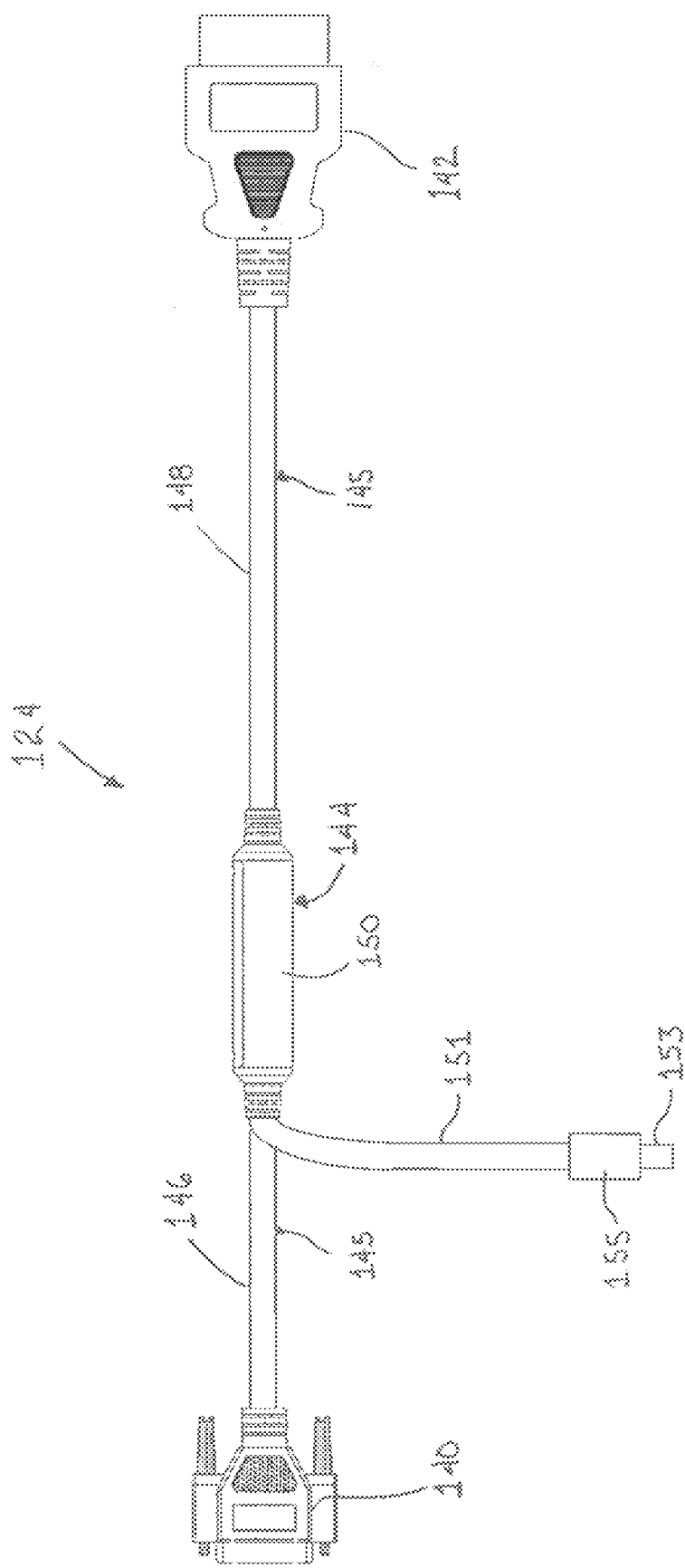
FIG. 7 is a top plan view of an alternatively configured cable in accordance with an aspect of the present invention.

Still further, an alternatively configured cable 124 in accordance with a further aspect of the present invention is illustrated in FIG. 7. Cable 124 is similarly constructed to cable 24 discussed above, with like components of cable 124 to that of cable 24 being identified with similar reference numerals as used with cable 24, but with "100" added thereto. Due to the similarities, not all of the like components of cable 124 are discussed herein.

As shown, cable 124 includes a pair of connectors 140, 142 at opposed ends of cable 124, and includes an oscilloscope module 144 having a housing 150 disposed along and integrated or connected with a flexible cable 145 between connectors 140, 142, where connector 140 is configured for connecting to a VCI 20 and connector 142 is configured for connecting to a diagnostic port 26 of a vehicle 22. The flexible cable 145 comprises a flexible first cable portion 146 extending between connector 140 and oscilloscope module 144 and a flexible second cable portion 148 extending between connector 142 and oscilloscope module 144. Although not shown in FIG. 7, an oscilloscope PCB having an oscilloscope chip is contained within housing 150 in like manner to cable 24 discussed above. In addition, a separate or additional cable or cable portion 151 configured as a USB cable in the illustrated embodiment extends from housing 150, where cable 151 includes a connector 153 at the opposite end of housing 150, where connector 153 includes a connector body 155 and is constructed as a USB connector. In the embodiment of cable 124, output wires 88b from PCB 54 extend within cable 151 to connector 153, whereby connector 153 may then be separately connected to an additional port of VCI 20, such as a USB port, with the wire bundle 86 extending from connector 142 through housing 50 and to connector 140. Moreover, in the embodiment of FIG. 7, connector 140 is not operably connected with PCB 54, but as noted connector 140 is operably connected with connector 142 whereby data signals may be exchanged to and from electronic system 28 and VCI 20 via the cable 124.

In the illustrated embodiment, cable portions 46 and 48 are configured as UL2464 multi-conductor cables with 22AWG insulated conductor wires and an outer PVC jacket surrounding wire bundles 84, 86. It should be appreciated, however, that alternative cable and wire configurations may be employed within the scope of the present invention. The ends of wires 88a, 88b opposite from oscilloscope module 44 may connect with a circuit board 83 (FIG. 2C) contained within the connector body 41 of connector 40, where the circuit board in turn has wired connections to the pin receptacles 41b of connector 40. Similarly, connector body 43 of connector 42 includes an internal circuit board for receiving conductors within the flexible cable 45. As noted, wire bundle 86 may additionally pass through housing 50 beneath cavity 52, with housing 50 being over molded to the ends of cable portions 46, 48 and over bundle 86. Housing 50 may be constructed of a flame retardant material.

Figure 8:
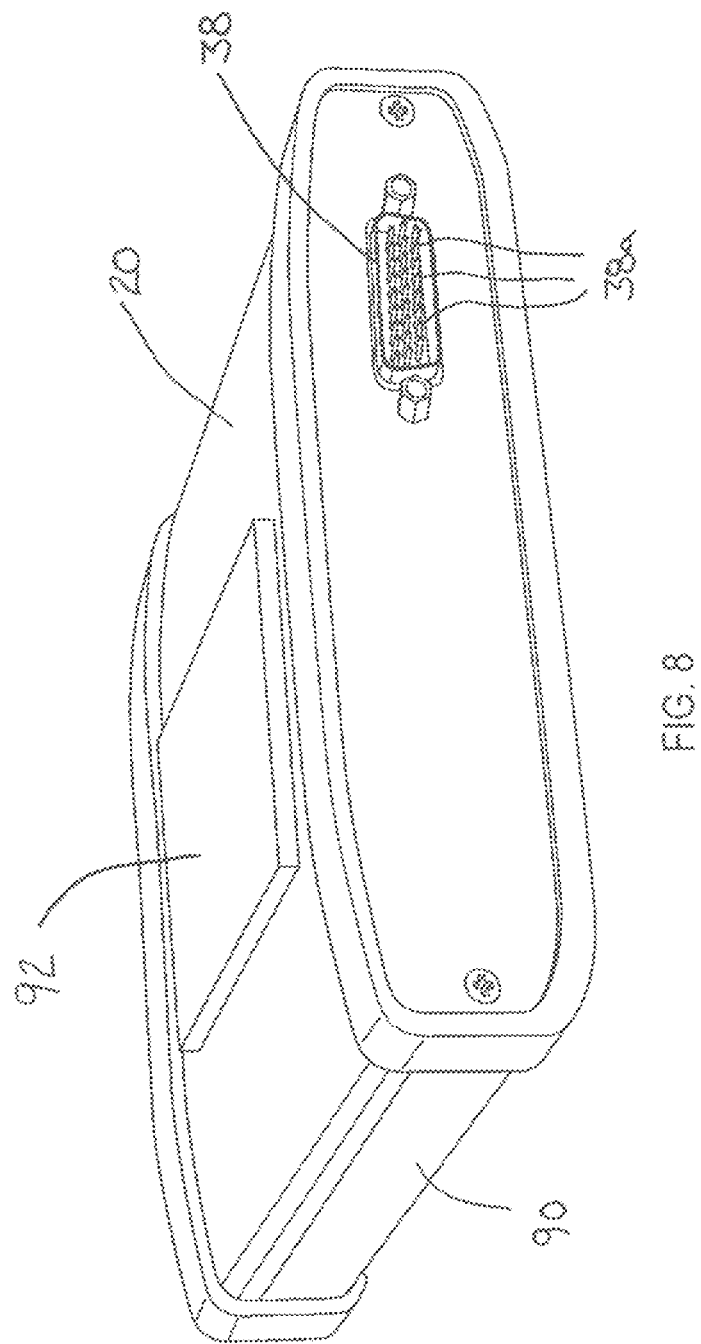
FIG. 8 is a perspective view of the vehicle interface device of FIG. 1.

Wires 88a of bundle 86 are able to convey data signals between VCI 20 and the vehicle electronic system 28. An exemplary VCI 20 is shown in FIG. 8 and, in addition to connector 38, includes a housing 90 and a display screen 92, such as a touchscreen, for interfacing with VCI 20. VCI 20 may be variously configured and constructed, and may be used as a standalone device, such as for diagnostic evaluations, or may be configured for further interfacing with a computer, such as computer 94 shown in FIG. 1, for additional operations.

Figure 9:
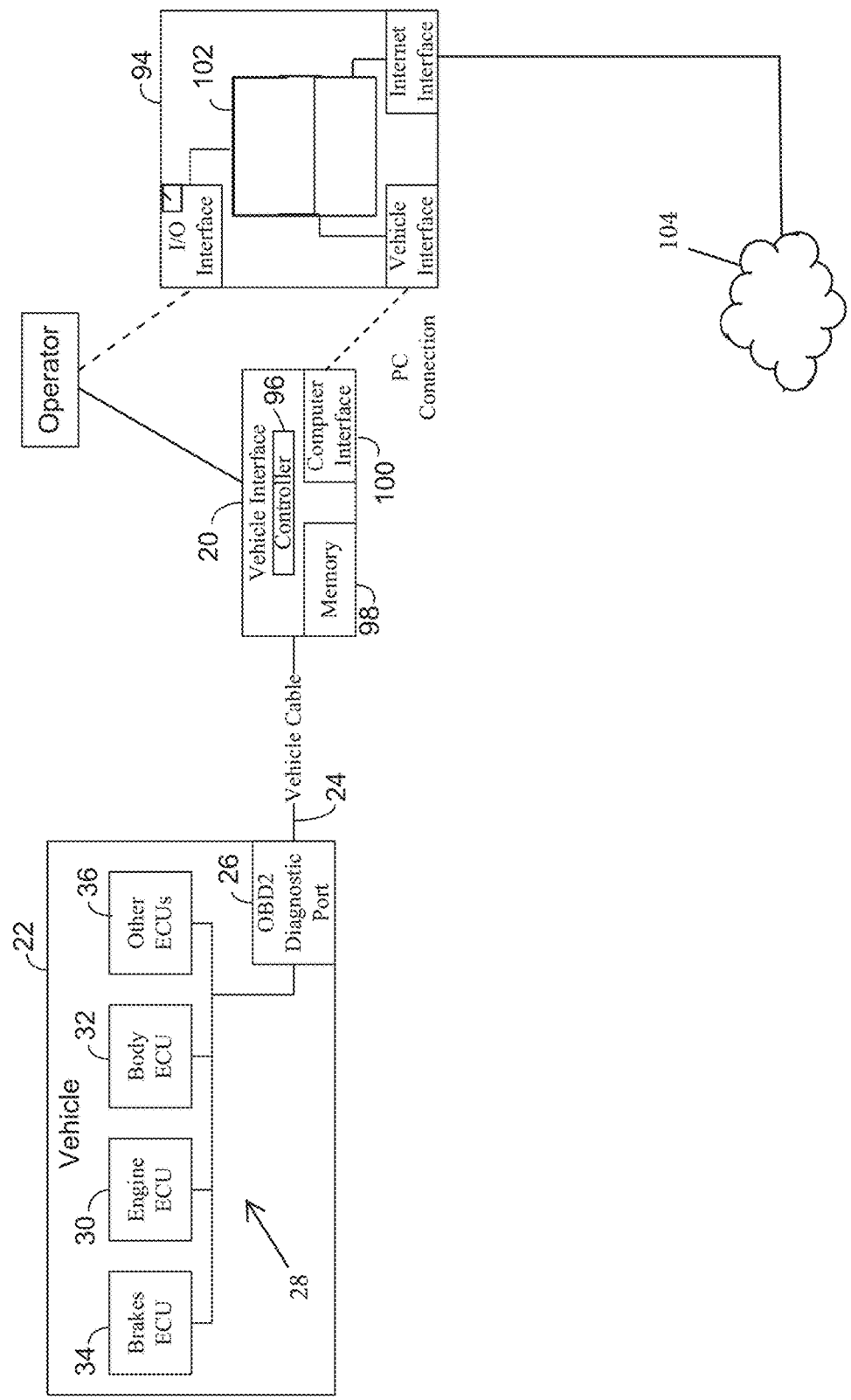
FIG. 9 is an exemplary schematic illustration of a vehicle interface cable connected with an electronic system of a vehicle via the vehicle interface cable of FIG. 1.

In the illustrated embodiment, with further reference to FIG. 9, VCI 20 is illustrated with cable 24 operatively in communication with port 38 and includes a controller 96, such as in the form of a processor or micro-processor and interface circuitry to facilitate communication between the ECUs and the VCI 20, with VCI 20 including a database of vehicle protocols found in a local memory 98 that allow communication with the ECUs of various makes and models of vehicles. Controller 96 may additionally support and enable the processing of various software programs of VCI 20, including for operation of the hardware components of VCI 20. It should be appreciated that controller 96 may comprise one or more processors. In the illustrated embodiment the VCI 20 includes a vehicle communication protocol operating in accordance with the SAE J2534 standard, although additional or alternative protocols may be employed. In an alternative configuration, VCI 20 may also include a computer interface 100, such as for connection with a local computer 94, such as via standard interfaces, such as USB, Bluetooth, Wi-Fi, or the like. VCI 20 may include additional ports or connectors, including USB, Ethernet and other such connectors. The hardware and software of VCI 20 thus enables communication between VCI 20 and the electronic system 28 of vehicle 22.

In an embodiment in which VCI 20 further interfaces with a computer 94, such as a laptop, as also understood from FIG. 9, computer 94 may include a database 102 of one or more diagnostic software scanning programs or applications, such as applications developed by an original equipment automotive manufacturer ("OEM"), or an aftermarket diagnostic company. The diagnostic software scanning programs may be used to diagnose, scan and/or program the electronic system of a vehicle. Alternatively and/or additionally, computer 94 may be configured to establish a remote connection, such as via an Internet connection 104, for accessing a database of diagnostic applications provided by an OEM or third party supplier for use in diagnosing, scanning and/or programming the electronic system 28 of vehicle 22.

The present invention thus provides an interface cable 24 that includes an integrated oscilloscope configured to provide measurements power to VCI 20. Accordingly, VCI 20 may be configured to utilize such measurements to detect faults in the electronic system 28 of a vehicle 22, and/or to be used to detect tampering with the vehicle, such as to the electronic system 28 and/or sensors on various systems of the vehicle 22, such as emissions related sensors. It should be appreciated that variously configured interface cables 24 and 124 may be provided within the scope of the present invention. For example, cables 24 and/or 124 may be constructed in various lengths. Still further, although oscilloscope module 44 is shown as being centrally located between connectors 40 and 42, the oscilloscope module may be alternatively located along the length of the cable, including for example being positioned adjacent connector 40, whereby only a single flexible cable portion may be required. Moreover, it should be further appreciated that connectors 40 and 42 may be alternatively configured, such as with an alternative number of pins or pin receptacles, and/or to be male instead of female or vice versa.

Other changes and modifications in the specifically described embodiments can be carried out without departing from the principles of the present invention which is intended to be limited only by the scope of the appended claims, as interpreted according to the principles of patent law including the doctrine of equivalents.

The embodiments of the invention in which an exclusive property or privilege is claimed are defined as follows:

1. A vehicle communication interface cable comprising:
   a vehicle connector having a connector body and configured to connect to a diagnostic port of a vehicle;
   a vehicle communication interface connector having a connector body and configured to connect to a vehicle communication interface;
   a cable portion extending between said vehicle connector and said vehicle communication interface connector, wherein said cable portion enables communication from said vehicle connector to said vehicle communication interface connector; and
   an oscilloscope circuit;
   wherein said oscilloscope circuit is integrated with said cable portion and is operatively connected with said vehicle connector to obtain measurements from the diagnostic port when said vehicle connector is connected to the diagnostic port, and wherein said oscilloscope circuit is operatively connected with said vehicle communication interface connector to provide measurements from the diagnostic port to the vehicle communication interface when said vehicle communication interface connector is connected to the vehicle communication interface.

2. The vehicle communication interface cable of claim 1, wherein said vehicle connector comprises a plurality of pins, and wherein wires that are in operative communication with said pins extend from said vehicle connector to said oscilloscope circuit within said cable portion.

3. The vehicle communication interface cable of claim 2, wherein additional wires extend from said oscilloscope circuit to said vehicle communication interface connector.

4. The vehicle communication interface cable of claim 1, wherein said cable portion comprises a first cable portion and a second cable portion and a housing with said oscilloscope circuit disposed within said housing, and with said first cable portion extending from said vehicle connector to said housing and with said second cable portion extending from said vehicle communication interface connector to said housing.

5. The vehicle communication interface cable of claim 1, wherein said vehicle connector comprises sixteen pins.

6. The vehicle communication interface cable of claim 5, wherein sixteen wires are operatively connected with said sixteen pins and said oscilloscope circuit.

7. The vehicle communication interface cable of claim 1, wherein said vehicle communication interface connector comprises twenty-six pin receptacles.

8. The vehicle communication interface cable of claim 1, wherein said oscilloscope circuit comprises a printed circuit board.

9. The vehicle communication interface cable of claim 8, wherein said printed circuit board comprises an oscilloscope integrated circuit and a multiplexer integrated circuit.

10. The vehicle communication interface cable of claim 1, wherein said oscilloscope circuit measures resistance values at the diagnostic port when said vehicle connector is connected to the diagnostic port.

11. The vehicle communication interface cable of claim 1, wherein said oscilloscope circuit measures voltage waveforms at the diagnostic port when said vehicle connector is connected to the diagnostic port.

12. The vehicle communication interface cable of claim 1, further comprising an additional vehicle communication interface connector and an additional cable portion, wherein said additional vehicle communication interface connector is connected to said additional cable portion and said additional cable portion is integrated with said cable portion, and wherein said additional vehicle communication interface connector is configured to connect to the same vehicle communication interface as said vehicle communication interface connector;
wherein said interface cable is configured to communicate signals between said additional vehicle communication interface connector and said vehicle connector.

13. The vehicle communication interface cable of claim 12, wherein said vehicle communication interface connector comprises a USB connector and said additional vehicle communication interface connector is not in operative communication with said oscilloscope circuit.

14. A vehicle communication system, said system comprising:
a vehicle communication interface cable having opposed ends and a vehicle communication interface, wherein said vehicle communication interface cable is selectively coupled to said vehicle communication interface at one end and is selectively coupled to a diagnostic port of a vehicle at the other end;
said vehicle communication interface cable comprising at one end a vehicle communication interface connector having a connector body and configured to connect to said vehicle communication interface, and comprising a vehicle connector at the other end having a connector body and configured to connect to a diagnostic port of a vehicle, said vehicle communication interface cable further comprising oscilloscope circuitry, and a cable portion extending between said vehicle connector and said vehicle communication interface connector;
wherein said oscilloscope circuitry is integrated with said cable portion and is operatively connected with said vehicle connector to obtain measurements from the diagnostic port when said vehicle connector is connected to the diagnostic port, and wherein said oscilloscope circuitry is operatively connected with said vehicle communication interface connector to provide measurements from the diagnostic port to said vehicle communication interface when said vehicle communication interface connector is connected to said vehicle communication interface.

15. The vehicle communication system of claim 14, wherein said vehicle connector comprises a plurality of pins, and wherein wires that are in operative communication with said pins extend from said vehicle connector to said oscilloscope circuitry within said cable portion.

16. The vehicle communication system of claim 15, wherein additional wires extend from said oscilloscope circuitry to said vehicle communication interface connector.

17. The vehicle communication system of claim 14, wherein said cable portion comprises a first cable portion and a second cable portion and a housing with said oscilloscope circuit disposed within said housing, and with said first cable portion extending from said vehicle connector to said housing and with said second cable portion extending from said vehicle communication interface connector to said housing.

18. The vehicle communication system of claim 14, wherein said vehicle connector comprises sixteen pins and wherein sixteen wires are operatively connected with said sixteen pins and said oscilloscope circuitry, and wherein said vehicle communication interface connector comprises twenty-six pin receptacles.

19. The vehicle communication system of claim 14, further comprising an additional vehicle communication interface connector and an additional cable portion, wherein said additional vehicle communication interface connector is connected to said additional cable portion and said additional cable portion is integrated with said cable portion, and wherein said additional vehicle communication interface connector is configured to connect to said vehicle communication interface, and wherein said interface cable is configured to communicate signals between said additional vehicle communication interface connector and said vehicle connector.

20. A cable comprising:
a first connector comprising a first body and a first plug;
a second connector comprising a second body and a second plug;
an oscilloscope circuit; and
a cable portion extending between said first connector and said second connector;
wherein said oscilloscope circuit is integrated with said cable portion, and wherein a first group of wires extend from said oscilloscope circuit to said first connector and a second group of wires extend from said oscilloscope circuit to said second connector.

21. The cable of claim 20, wherein said cable portion comprises a first cable portion and a second cable portion and a housing with said oscilloscope circuit disposed within said housing, and with said first cable portion extending from said first connector to said housing and with said second cable portion extending from said second connector to said housing, wherein said first group of wires extend within said first cable portion and said second group of wires extend within said second cable portion.

22. The cable of claim 21, wherein said first connector comprises a plurality of pins, and wherein said first group of wires are in operative communication with said pins.

* * * * *